United States Patent
Del Monte

(10) Patent No.: US 11,581,350 B2
(45) Date of Patent: Feb. 14, 2023

(54) SEMICONDUCTOR OPTICAL SENSOR FOR VISIBLE AND ULTRAVIOLET LIGHT DETECTION AND CORRESPONDING MANUFACTURING PROCESS

(71) Applicant: LFOUNDRY S.R.L., Avezzano (IT)

(72) Inventor: Andrea Del Monte, Avezzano (IT)

(73) Assignee: LFOUNDRY S.R.L.

( * ) Notice: Subject to any disclaimer, the term of this patent is extended or adjusted under 35 U.S.C. 154(b) by 211 days.

(21) Appl. No.: 16/771,839

(22) PCT Filed: Dec. 12, 2018

(86) PCT No.: PCT/IB2018/059950
§ 371 (c)(1),
(2) Date: Jun. 11, 2020

(87) PCT Pub. No.: WO2019/116266
PCT Pub. Date: Jun. 20, 2019

(65) Prior Publication Data
US 2021/0193719 A1  Jun. 24, 2021

(30) Foreign Application Priority Data
Dec. 12, 2017 (IT) .................. 102017000143176

(51) Int. Cl.
*H01L 27/146* (2006.01)
*C09K 11/02* (2006.01)
*H01L 31/0232* (2014.01)

(52) U.S. Cl.
CPC ........ *H01L 27/14625* (2013.01); *C09K 11/02* (2013.01); *H01L 27/14621* (2013.01);
(Continued)

(58) Field of Classification Search
CPC .............. C09K 11/02; H01L 27/14627; H01L 27/14665; H01L 27/146; H01L 51/0074;
(Continued)

(56) References Cited

U.S. PATENT DOCUMENTS 5,990,506 A    11/1999  Fossum et al.
2004/0070039 A1*  4/2004  Sekine .............. H01L 27/14623
                                                              430/7
(Continued)

FOREIGN PATENT DOCUMENTS

EP    0843363 A1    5/1998
EP    1876648 B1    10/2015

OTHER PUBLICATIONS

PCT International Search Report and Written Opinion issued by the International Bureau for PCT Application No. PCT/IB2018/059950, dated Apr. 1, 2019, pp. 1-17.
(Continued)

*Primary Examiner* — Mouloucoulaye Inoussa
(74) *Attorney, Agent, or Firm* — The Belles Group, P.C.

(57) ABSTRACT

A semiconductor optical sensor (1) is provided with: a substrate (2) integrating a plurality of photodetector active areas (4); and a CMOS layer stack (6) arranged on the substrate (2) and including a number of dielectric (6a) and conductive (6b) layers. UV conversion regions (10) are arranged above a number of first photodetector active areas (4) to convert UV light radiation into visible light radiation towards the first photodetector active areas (4), so that the first photodetector active areas (4) are designed to detect UV light radiation. In particular, the first photodetector active areas (4) are alternated to a number of second photodetector active areas (4), designed to detect visible light radiation, in an array (15) of photodetection units (16) of the optical sensor (1), defining a single image detection area (15'),
(Continued)

sensitive to both UV and visible light radiation with a same spatial resolution.

15 Claims, 6 Drawing Sheets

(52) U.S. Cl.
CPC .. *H01L 27/14627* (2013.01); *H01L 27/14645* (2013.01); *H01L 27/14685* (2013.01); *H01L 27/14689* (2013.01); *H01L 31/02322* (2013.01)

(58) Field of Classification Search
CPC ........... H01L 51/0046; H01L 27/14643; H01L 27/14685; H01L 27/14621; H01L 27/14689; H01L 27/1462; H01L 27/14629; H01L 27/14645; H01L 27/14625; H01L 31/02322; H01L 27/14636; H01L 27/1464; H01L 27/1461; H01L 51/441; H01L 27/307; H01L 27/14; H01L 27/14609; H01L 51/4246; H01L 27/305; H01L 51/0078; H04N 5/378; H04N 9/04553; H04N 9/04557; H04N 9/04559; H04N 5/232122; H04N 5/36961; H04N 5/357; H04N 5/32; H04N 5/379; H04N 9/04563; H04N 5/369; H04N 5/3765; Y02E 10/549; G02B 7/34; G02B 7/365
USPC ......... 348/302, 273, 340, 9.01; 257/84, 432, 257/443, 40, 27.132, 31.127, 27.13; 438/70
See application file for complete search history.

(56) References Cited

U.S. PATENT DOCUMENTS

| | | | | |
|---|---|---|---|---|
| 2006/0158547 | A1* | 7/2006 | Komatsu | H01L 27/14621 348/340 |
| 2008/0188032 | A1* | 8/2008 | Rantala | C08L 83/14 257/E31.119 |
| 2009/0115874 | A1* | 5/2009 | Kim | H04N 9/0451 348/340 |
| 2010/0148291 | A1* | 6/2010 | Tivarus | G02B 5/208 257/E31.127 |
| 2011/0309462 | A1 | 12/2011 | Sargent et al. | |
| 2011/0310282 | A1* | 12/2011 | Toda | H01L 27/14607 348/308 |
| 2012/0104525 | A1* | 5/2012 | Wu | H01L 27/14627 257/E31.127 |
| 2012/0200728 | A1* | 8/2012 | Kobayashi | H01L 27/14627 257/E31.127 |
| 2012/0236190 | A1* | 9/2012 | Ogasahara | H01L 27/14621 348/E9.01 |
| 2012/0267743 | A1* | 10/2012 | Nakamura | G02B 5/201 257/E31.127 |
| 2012/0267745 | A1* | 10/2012 | Tsuji | H01L 27/14621 257/E31.127 |
| 2012/0322196 | A1* | 12/2012 | Kumano | H01L 27/14629 257/E31.127 |
| 2013/0057699 | A1* | 3/2013 | Ooki | H01L 27/14645 348/308 |
| 2013/0221194 | A1* | 8/2013 | Manabe | H01L 27/1464 257/228 |
| 2013/0256822 | A1* | 10/2013 | Chen | H01L 27/14689 257/443 |
| 2013/0292547 | A1* | 11/2013 | Tay | H01L 27/14625 257/443 |
| 2014/0118584 | A1* | 5/2014 | Lee | H01L 27/14612 348/262 |
| 2014/0197301 | A1* | 7/2014 | Velichko | H04N 5/37452 250/208.1 |
| 2014/0347493 | A1* | 11/2014 | Higashitsutsumi | H01L 27/14621 348/164 |
| 2015/0036104 | A1* | 2/2015 | Nordstrom | A61B 3/0025 351/242 |
| 2015/0171146 | A1* | 6/2015 | Ooki | H01L 27/14645 257/40 |
| 2015/0181187 | A1* | 6/2015 | Wu | H04N 9/04555 348/336 |
| 2015/0212294 | A1* | 7/2015 | Imamura | G03B 15/00 348/360 |
| 2015/0296162 | A1* | 10/2015 | Kurokawa | H01L 27/1464 257/43 |
| 2015/0372036 | A1* | 12/2015 | Suh | H01L 27/14625 257/432 |
| 2015/0372042 | A1* | 12/2015 | Wan | H01L 27/14627 257/432 |
| 2015/0380450 | A1* | 12/2015 | Okamoto | H01L 27/14616 257/43 |
| 2016/0142660 | A1* | 5/2016 | Shen | H04N 5/361 438/69 |
| 2016/0240571 | A1* | 8/2016 | Baek | H01L 27/14625 |
| 2016/0351609 | A1 | 12/2016 | Borthakur | |
| 2017/0069679 | A1* | 3/2017 | Sargent | H01L 27/14627 |
| 2017/0084650 | A1* | 3/2017 | Goma | H01L 27/14621 |
| 2017/0092670 | A1* | 3/2017 | Okamoto | H01L 27/1255 |
| 2017/0374306 | A1* | 12/2017 | Vaartstra | H04N 5/2258 |
| 2018/0047766 | A1* | 2/2018 | Pyo | H01L 27/1463 |
| 2019/0081251 | A1* | 3/2019 | Obana | H01L 51/0073 |
| 2019/0115386 | A1* | 4/2019 | Ma | H04N 5/379 |
| 2019/0349555 | A1* | 11/2019 | Lee | H01L 27/14629 |
| 2021/0029317 | A1* | 1/2021 | Ando | H01L 27/14667 |

OTHER PUBLICATIONS

PCT International Preliminary Report on Patentability issued by the International Bureau for PCT Application No. PCT/IB2018/059950, dated Dec. 11, 2019, pp. 1-17.

"Technical Note on UV Conversion Coatings: Lumogen", by e2V technologies, A1A-CCDTN103 Issue 5, Jun. 2003.

* cited by examiner

SEMICONDUCTOR OPTICAL SENSOR FOR VISIBLE AND ULTRAVIOLET LIGHT DETECTION AND CORRESPONDING MANUFACTURING PROCESS

CROSS-REFERENCE TO RELATED PATENT APPLICATIONS

The present application is a U.S. national stage application under 35 U.S.C. § 371 of PCT Application No. PCT/IB2018/059950, filed Dec. 12, 2018, which claims priority to Italian Patent Application No. 102017000143176, filed Dec. 12, 2017. The disclosures of the aforementioned priority applications are incorporated herein by reference in their entireties.

TECHNICAL FIELD

The present solution relates to a semiconductor optical sensor capable of detecting both visible and ultraviolet light radiation, and to a corresponding manufacturing process; in particular, the following disclosure will make reference to a semiconductor optical sensor based on Complementary Metal-Oxide-Semiconductor (CMOS) technology.

BACKGROUND ART

As it is known, there are several applications, such as in the space, medical, or consumer-electronics fields, where detection of both visible light radiation (with wavelength in the range of 380-780 nm) and ultraviolet—UV light radiation (with wavelength of less than 380 nm) is required.

For example, detection of the so called "UV index" is a feature implemented in portable electronic devices in order to evaluate the quantity of UV radiation in the external environment, and the same portable electronic devices may be further provided with visible light image sensors, in order to capture photos or videos.

It is also known that UV detection poses a number of issues.

In particular, absorption depth of UV light radiation is very small (a few nanometers), so that a portion of radiation is absorbed in the structure of the optical sensor before reaching an active detection area thereof, thus not contributing to the signal change and causing Quantum Efficiency—QE—losses.

Insulating layers, such as silicon nitride layers, in the structure of a standard optical sensor may have a certain absorption in the UV range, again causing a worsening of QE performance. This may suggest use of sensors without passivation layers, but the absence of passivation layers determines a worse reliability.

Furthermore, UV radiation directly incident on a silicon substrate may cause damage (and thus reliability concerns), an increase of defect density (i.e. desorption of hydrogen from dangling bonds), or charge-up of dielectric layers.

The use has therefore been suggested of layers of a suitable material, being able to convert UV light radiation into visible light radiation, which may then be detected by traditional detection structures operating in the visible-light wavelength range.

For example, a "Technical note on UV Conversion Coatings: Lumogen", by e2V technologies, shows that the performance of front illuminated Charge Coupled Devices (CCDs) in the ultraviolet (UV) region of the optical spectrum may be enhanced by provision of a UV conversion coating made of materials that can absorb UV light (having higher energy than visible light) and convert it to a longer wavelength, or lower energy, visible radiation; these materials are called Phosphors. It has been found that these materials may be excited by light of higher energy (shorter wavelength) and emit light of lower energy (longer wavelength); this is the reason for which these materials are also called as "down-conversion materials". In particular, use of an organic phosphor called Lumogen, also known as Lumilux, Liumogen and Lumigen, is discussed; the absorbed UV radiation causes the Lumogen phosphor to emit in the spectral band of 500-650 nm, with a high QE factor.

In general, an electronic device for visible and ultraviolet light detection comprises two different and separate optical sensors, which are used to detect visible and, respectively, UV light radiation; each optical sensor is optimized for detection of the respective wavelength range of an incident light radiation and manufactured in a respective die, or chip, of semiconductor material.

However, implementing a single chip capable of performing both visible and UV light detection may be desirable, for example in the field of portable or mobile devices, in order to reduce area occupation and manufacturing costs and also in order to lower power consumption.

US 2016/0142660 A1 discloses a solution for integrating both visible light and UV light detection ability into one single chip.

As shown schematically in FIG. 1, the image sensor 100 disclosed in US 2016/0142660 A1 comprises a semiconductor substrate 110 divided into a visible light section, integrating a visible light image sensor 120, and a separate and distinct UV section, integrating a UV sensor 130.

A plurality of sensor cells are formed on the substrate 110, in both the visible light and UV sections, each of the plurality of sensor cells including a photo detector sensitive to visible light.

The single-chip image sensor comprises a UV coating layer, converting UV light into visible light, positioned in the UV section, so that the sensor cells formed in the UV section are able to sense UV light radiation, while the sensor cells formed in the visible light section may still sense visible light radiation.

If compared with a solution that includes a visible light image sensor module and a separate UV sensor module, the solution discussed in US 2016/0142660 A1 is more compact and cost effective.

However, the present Applicant has realized that this solution is still not satisfactory; in particular, this solution does not allow to detect a single image containing both visible and UV light information, at a same time and with a same spatial resolution.

Indeed, in the solution discussed above, the UV light sensor and the visible light sensor regions occupy separate and distinct areas of the same chip, thus not allowing to reconstruct a single image with both ranges of the signal spectrum, with a same spatial resolution.

DISCLOSURE OF INVENTION

The aim of the present solution is to provide an improved optical sensor, allowing to overcome the above limitations of the known solutions.

According to the present solution, a semiconductor optical sensor and a corresponding manufacturing process are consequently provided, as defined in the appended claims.

BRIEF DESCRIPTION OF THE DRAWINGS

For a better understanding of the present invention, preferred embodiments thereof are now described purely by way of non-limiting example and with reference to the attached drawings, wherein.

BEST MODE FOR CARRYING OUT THE INVENTION

As will be discussed in details in the following, an aspect of the present solution provides a single-chip optical, or image, sensor, provided with both visible and UV detection ability in a same die of semiconductor material; the optical sensor includes an array of sensing cells, alternating in a single detection area both UV detection cells and visible light detection cells, so that the die implements detection of UV and visible light radiation, not only at the same time, but also with a same spatial resolution.

Figure 1:
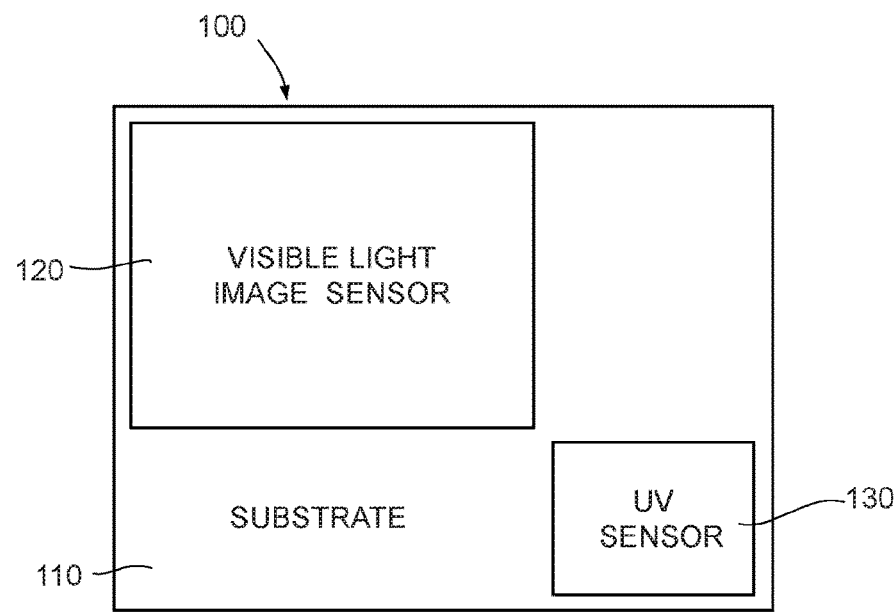
FIG. 1 is a schematic representation of a known single-chip optical sensor.
Figure 2:
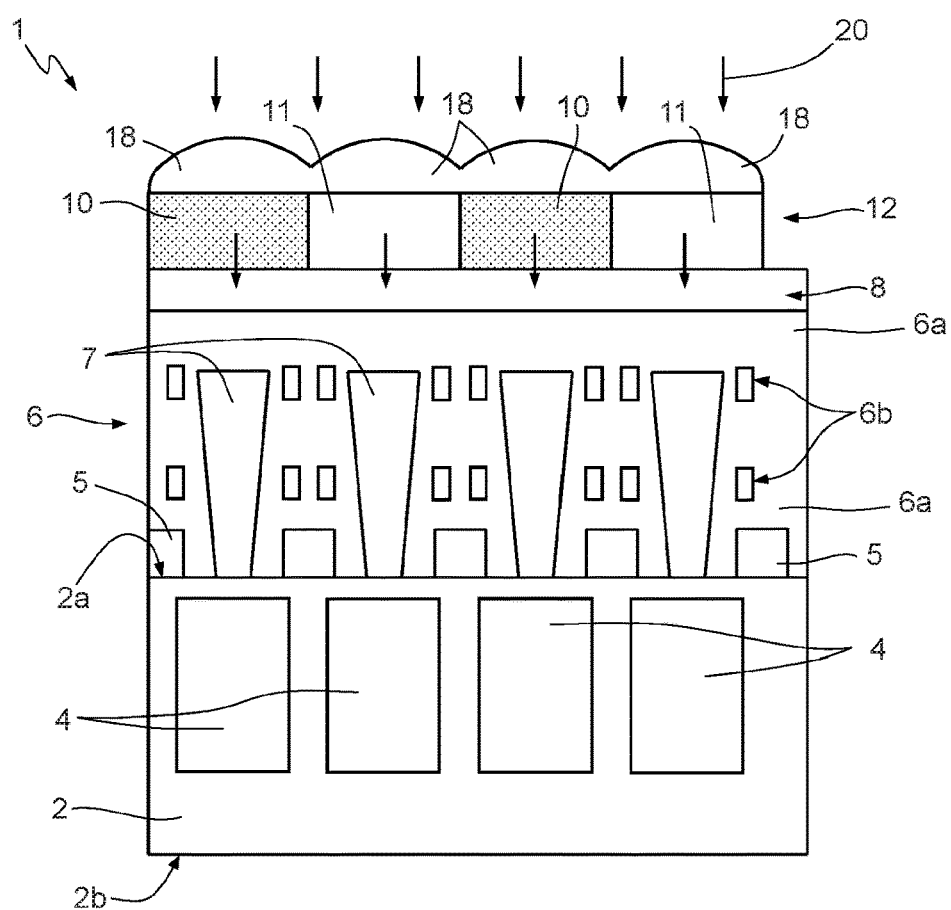
FIG. 2 is a cross-section of a semiconductor optical sensor, according to a first embodiment of the present solution.

FIG. 2 shows an optical sensor 1 according to a first embodiment of the present solution, relating, by way of example, to a front-side illuminated (FSI) photodetector, made with CMOS semiconductor techniques.

The optical sensor 1 comprises a substrate 2 of semiconductor material, in particular silicon, having a front surface 2a and a back surface 2b, here defining a first external surface of the optical sensor 1.

A plurality of photodetector active areas 4 are formed in the substrate 2, at the first surface 2a thereof, each defining a photodetection area of a respective photodetection unit (so called "pixel") of the photodetector. Photodetector active areas 4 are doped regions of a doping type opposite to that of the substrate 2 and may be formed e.g. via implantation or diffusion of doping agents. Photodetector active areas 4 are arranged in an array pattern in the substrate 2.

Conveniently, the photodetector active areas 4 can be designed to define photodiode, phototransistor, or photoresistor active areas. The photons impinging on the photodetector active areas 4 are converted into charge carriers producing an output electric signal proportional to the intensity of the incident light.

For example, photodiode active areas are realized, in the simplest form, as p-n (or n-p) junctions configured so that the n (or p) active regions are depleted from charge carriers (such as electron/hole pairs) and, hence, incident photons generate electron/hole pairs collected by the depletion regions of the photodiodes. As is known, also pnp (or npn) junctions can be conveniently formed.

Gate regions 5 of the photodetection units, made of a suitable metal material, are formed on the front surface 2a of the substrate 2, arranged in a position vertically corresponding to the area of separation between two respective photodetector active areas 4.

The optical sensor 1 further includes a CMOS stack 6 comprised of a number of stacked dielectric layers 6a, e.g. made of a silicon oxide, and conductive layers 6b, e.g. made of a metal material. In the example shown in FIG. 2, two metal layers are shown, but it is clear that a different number of metal layers may be provided. A top dielectric layer 6a defines an external surface of the stack 6, opposite to the front surface 2a of substrate 2.

In a manner not shown, but which will be clear for a skilled person, conductive vias and interconnections are formed in the CMOS stack 6 to define electrical conductive paths towards the photodetector active areas 4 and towards electrical contact pads (also not shown) arranged at the external surface of the stack 6, so that output electric signals generated by the photodetector active areas 4 may be provided to an external electrical system.

In the embodiment shown in FIG. 2, light channelling regions (so called "light pipes") 7 are formed through the stack 6, from the top dielectric layer 6a towards the front surface 2a of the substrate 2, each arranged on a respective photodetector active area 4 and configured to guide light radiation towards the respective photodetector active area 4. The light pipes 7 are formed of a suitable material transparent to visible light radiation, for example an organic polymer, such as a siloxane polymer.

A passivation layer 8, e.g. of silicon nitride, is formed above the stack 6, on the external surface thereof defined by the top dielectric layer 6a.

According to a particular aspect of the present solution, the optical sensor 1 further includes UV conversion regions 10, here formed on the passivation layer 8, made of a suitable material able to convert UV light radiation into visible light radiation. UV conversion regions 10 are formed of an organic material in which a fluorescent dye is immersed, designed to perform the UV conversion; for example, the organic material may be a siloxane polymer, like Silecs SC-480, and the dye a fluorescent phosphor like the Lumogen. Examples of down conversion materials that can absorb UV light and emit visible light include, for example, the above cited Lumogen, Coronene, AlQ3', ZnS:Mn, and the like.

UV conversion regions 10 are arranged vertically corresponding to the positions of some of the photodetector active areas 4, which are intended to perform detection of the UV light radiation.

Moreover, filter regions 11 are formed on the passivation layer 8, made of a suitable material transparent to visible light radiation and opaque to the UV light radiation, such as a siloxane organic polymer. Filter regions 11 may be transparent only to a respective portion of the visible spectrum, thus implementing RGB (Red, Green and Blue) filters, designed to filter (in a known manner, here not discussed in details) the light radiation.

Filter regions 11 are alternated to the conversion regions 10 on the passivation layer 8, according to a desired array pattern; in particular, filter regions 11 are arranged vertically corresponding to the positions of the photodetector active areas 4, which are intended to perform detection of the visible light radiation.

The optical sensor 1 thus includes a capping layer 12 on the passivation layer 8, formed by the alternated conversion and filter regions 10, 11.

Figure 3:
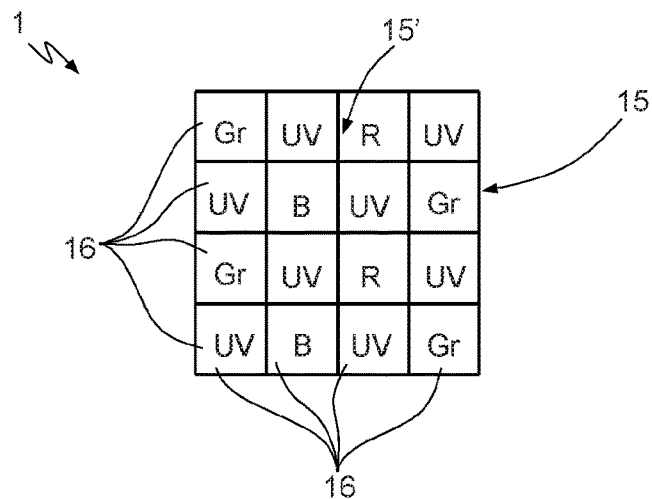
FIG. 3 is a schematic top-down representation of the optical sensor of FIG. 2.

FIG. 3 shows a schematic top-down view of a possible pattern for the array 15 of photodetection units (or pixels) 16 of the optical sensor 1, each including a respective photo-detection area. In this case, the array includes rows and columns wherein pixels for detection of UV light radiation are alternated to pixels for detection of a respective color (Red 'R', Green 'Gr' or Blue 'B') of the visible light radiation.

It is underlined that other patterns of alternating pixels for UV and visible light radiations may be equally envisaged in the array 15, as will be clear for a skilled person; for example, each pixel sensitive to UV light radiation may be alternated to two or more pixels sensitive to visible light radiation, along the rows and/or columns of the array 15.

In any case, the array 15 defines a single image detection area 15', sensitive to both UV and visible light radiation, at a same time and with a same spatial resolution.

The optical sensor 1, as shown in FIG. 2, may further include micro-lens units 18, arranged on the capping layer 12, vertically corresponding to a respective photodetector active area 4 and pixel of the photodetector, in order to suitably focus (in a known manner, here not discussed in detail) the incoming electromagnetic radiation and obtain a collimated beam towards the photodetector active areas 4.

During operation, light radiation, denoted with 20 in the above FIG. 2, from the external environment, reaches the optical sensor 1 and in particular the capping layer 12, via the micro-lens units 18, if present, and, through the same capping layer 12, reaches the underlying photodetector active areas 4. In particular, all the photodetector active areas 4 receive visible light radiations, either directly through the filter regions 11 (possibly implementing RGB filters), or via the down-conversion performed by the UV conversion regions 10, which convert UV light radiation into visible light radiation.

Photodetector active areas 4 collect the received photons and generate corresponding output electric signals that are routed through the CMOS stack 6 towards the electrical contact pads at the external surface thereof, for communication to an external processing system. In a possible embodiment, comparing the signal collected on the pixels covered with conversion material and the pixels covered with the material absorbing UV radiation and transparent to visible light, it is possible to reconstruct with more accuracy the distribution of UV intensity focused on the sensor surface.

Figure 4A:
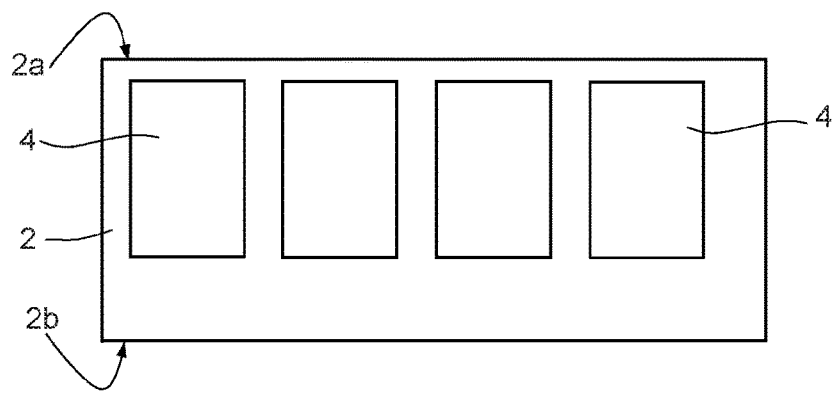
FIGS. 4A-4D are cross-sections of the optical sensor of FIG. 2, in subsequent steps of a corresponding manufacturing process.

As shown in FIG. 4A, the manufacturing process of the optical sensor 1 first envisages formation of the photodetector active areas 4 within the substrate 2, e.g. via diffusion or implantation of dopant atoms.

Figure 4B:
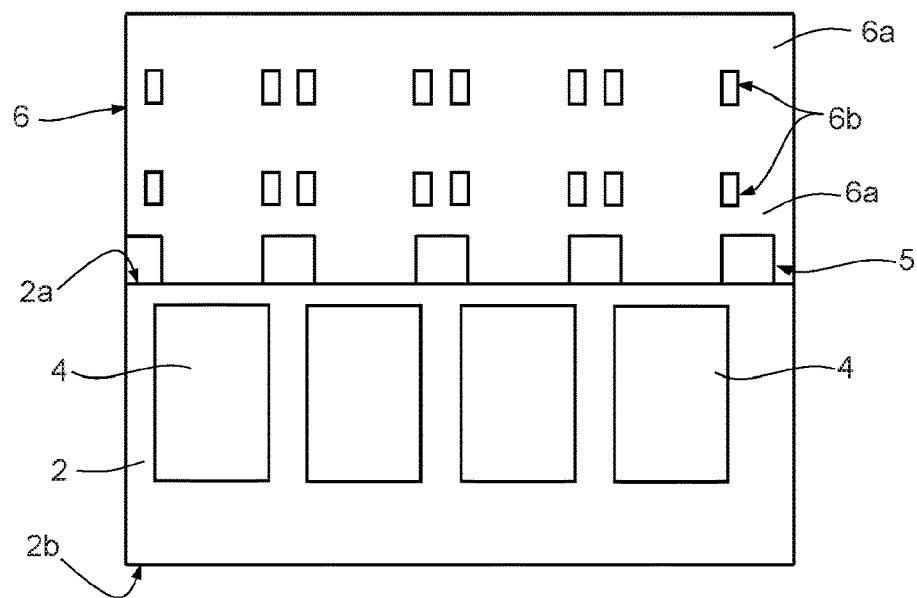

The gate regions 5 are then formed on the front surface 2a of the substrate 2, via deposition and photolithographic patterning of a metal layer; subsequently, the CMOS stack 6, including the stacked dielectric layers 6a and conductive layers 6b, is formed, via deposition and patterning of alternated dielectric and metal layers, as shown in FIG. 4B.

Figure 4C:
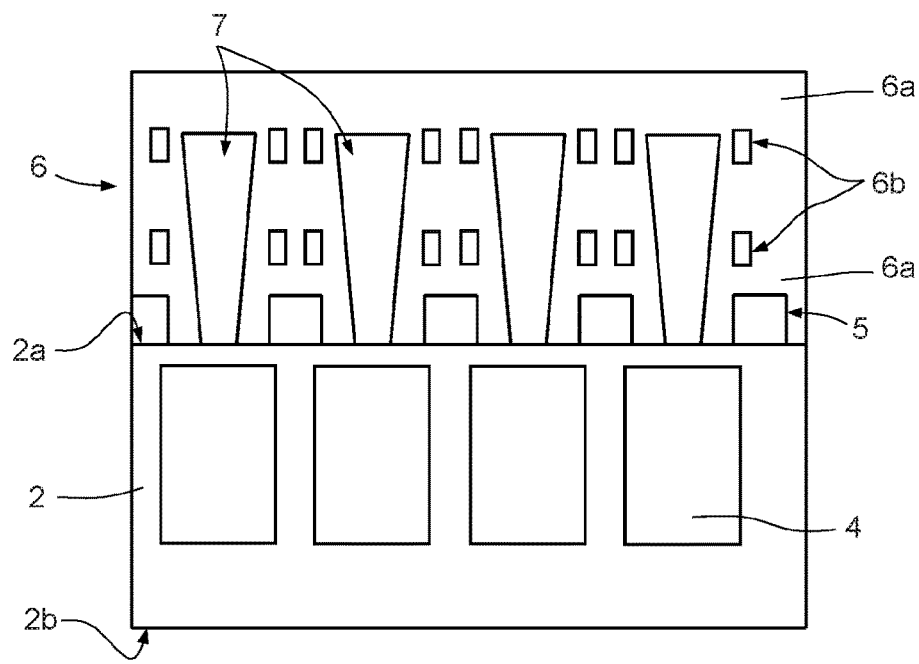

The light channelling regions 7 are then formed through the stack 6, as shown in FIG. 4C; in particular, trenches are first formed through the layers of the CMOS stack 6, reaching the front surface 2a of the substrate, and the same trenches are filled with a suitable material, transparent to the visible light, via deposition of a photo-patternable material, which is then removed outside of the same trenches. As in the example shown, top dielectric layer 6a may be formed on the light channelling regions 7.

Figure 4D:
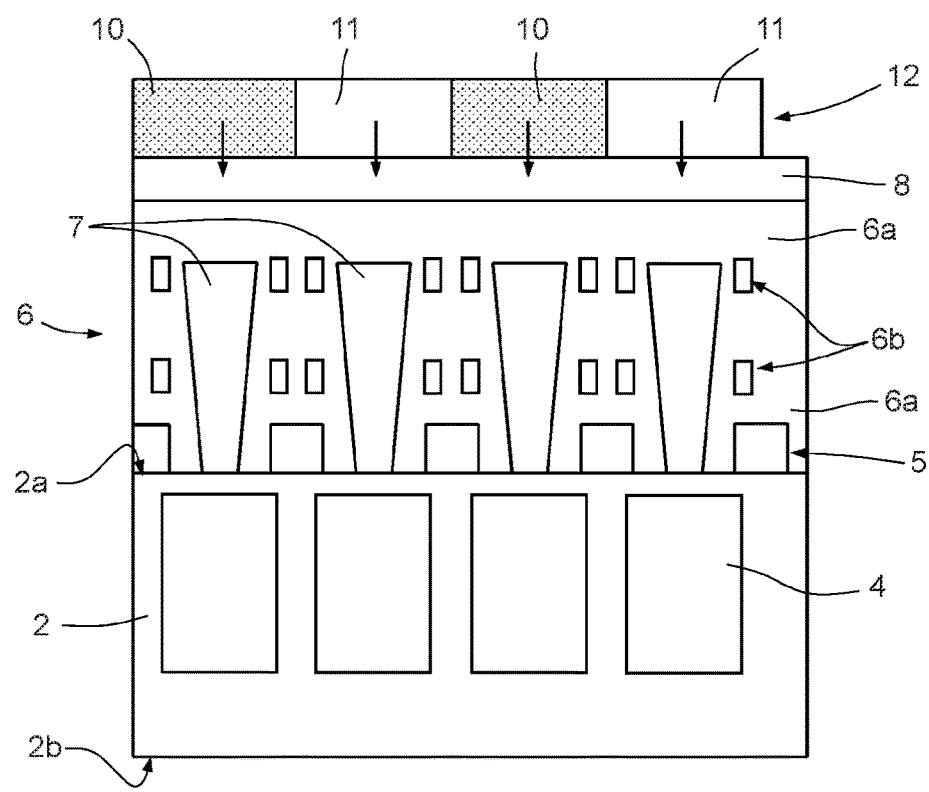

Afterwards, as shown in FIG. 4D, the passivation layer 8 is formed on the CMOS stack 6, via deposition, and the capping layer 12 is formed thereon, with the filter regions 11 alternated to the UV conversion regions 10.

In particular, a possible embodiment may envisage use of a fluorescent dye dispersed in a photo-patternable organic material layer, to create patches of fluorescent material defining UV conversion regions 10, on top of some of the pixels of the sensor array; the remaining pixels of the sensor array are covered with a transparent material, or with red, green, blue filters. The organic material layer may be removed out of the photoactive area with a photolithographic process.

The micro-lens units 18 may then be formed on the capping layer 12, obtaining the resulting structure shown in FIG. 2.

Figure 5:
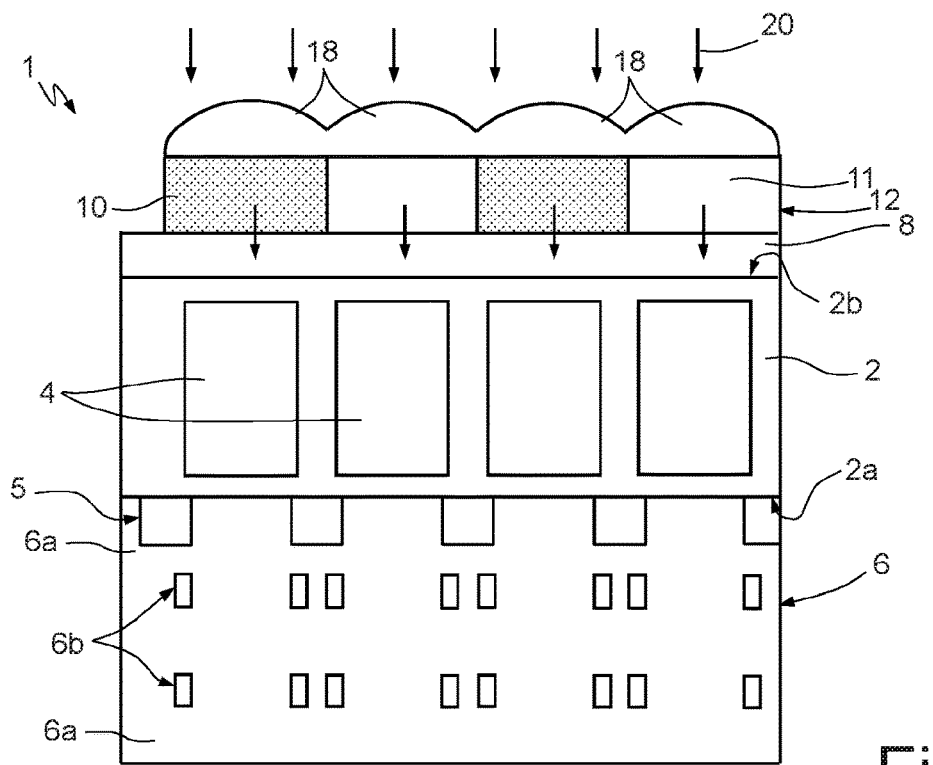
FIG. 5 is a cross-section of a semiconductor optical sensor, according to a further aspect of the present solution.

As shown in FIG. 5, the discussed embodiment may be implemented also for a back-side illuminated (BSI) photo-detector, made with CMOS semiconductor techniques.

In this case, the external surface of the CMOS stack 6, again formed on the front surface 2a of the substrate, defines the external surface of the optical sensor 1. The passivation layer 8 and the capping layer 12 are in this case formed on the back surface 2b of the substrate 2, with the micro-lens unit 18 again formed on the capping layer 12, if required.

This embodiment may afford the advantage of guiding the light radiation 20 from the external environment towards the photodetector active areas 4 within the substrate 2, minimizing interaction with metal lines.

A second embodiment of the present solution is now discussed, with reference to FIG. 6, relating again to a front-side illuminated photodetector.

In this second embodiment, the light channelling regions, here denoted with 7' are filled with a suitable material able to convert UV light radiation into visible light radiation, for example an organic material in which a fluorescent dye is immersed, thereby constituting the UV conversion region 10 of the optical sensor 1, here integrated within the CMOS stack 6; the organic material may be a siloxane polymer, containing the dye, such as a fluorescent phosphor like Lumogen.

The light channelling regions 7' are here formed through the CMOS stack 6, reaching the front surface 2a of the substrate 2, and moreover through the passivation layer 8, reaching an external surface thereof.

In the shown embodiment, the light channeling regions 7' are formed vertically corresponding to the positions of some of the photodetector active areas 4, which are intended to perform detection of the UV light radiation; on the contrary, no light channeling regions are here formed on the photodetector active areas 4, which are intended to perform detection of the visible light radiation.

Transparent regions 11' are in this case formed on the passivation layer 8, alternated to the filter regions 11 according to a desired array pattern.

In particular, in this case, transparent regions 11' are arranged in positions vertically corresponding the light channelling regions 7' and are designed to be transparent to the wavelength range of both visible and UV light radiation; while filter regions 11, arranged in positions vertically corresponding the photodetector active areas 4, which are intended to perform detection of the visible light radiation, are made of a suitable material transparent to visible light radiation and opaque to the UV light radiation.

The filter regions 11 may be transparent only to a respective portion of the visible spectrum, thus implementing RGB (Red, Green and Blue) filters, designed to filter (in a known manner, here not discussed in details) the light radiation.

The filter and transparent regions 11, 11' define in this case the capping layer 12 of the optical sensor 1, arranged on the passivation layer 8.

Also in this second embodiment, the optical sensor 1 therefore includes an array 15 of photodetection units (or pixels) 16, wherein pixels for detection of UV light radiation are alternated to pixels for detection of the visible light radiation, within a single image detection area 15', sensitive to both UV and visible light radiation, at the same time and with a same spatial resolution.

Moreover, the optical sensor 1 may again include the micro-lens units 18, arranged on the capping layer 12, vertically corresponding to a respective photodetector active area 4 and pixel of the photodetector.

Figure 7A:
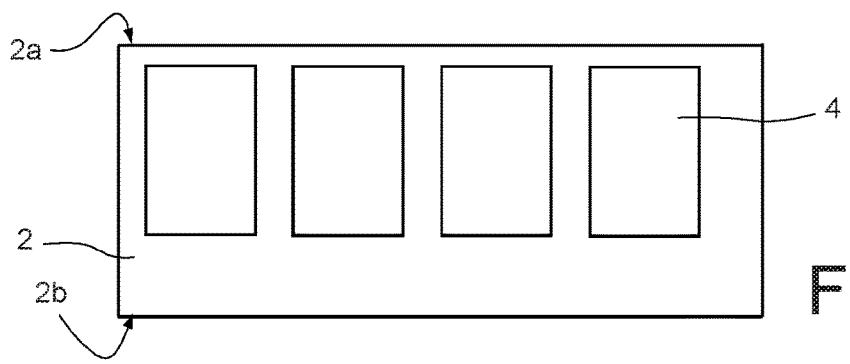
FIGS. 7A-7D are cross-sections of the optical sensor of FIG. 6, in subsequent steps of a corresponding manufacturing process.

The manufacturing process of the second embodiment again envisages, as shown in FIG. 7A, formation of the photodetector active areas 4 within the substrate 2, e.g. via diffusion or implantation of dopant atoms.

Figure 7B:
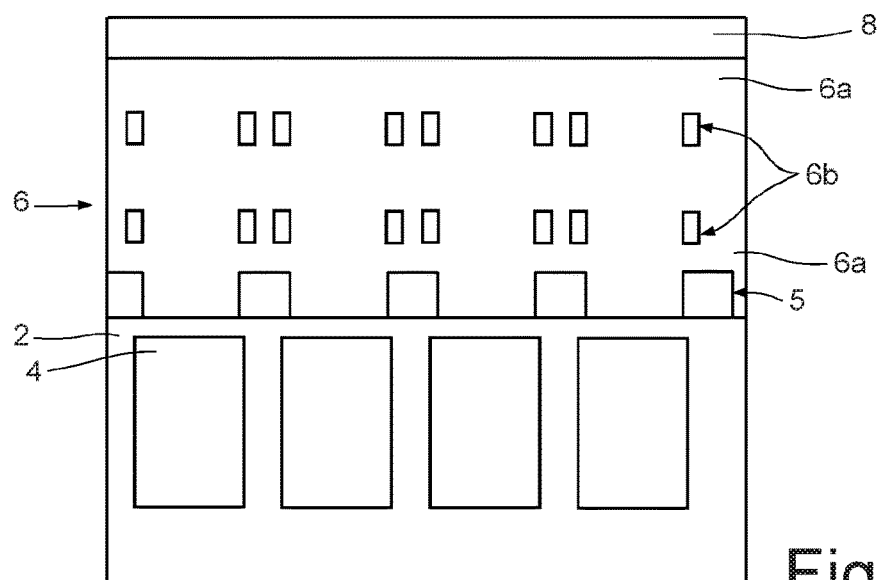

The gate regions 5 are then formed on the front surface 2a of the substrate 2, via deposition and photolithographic patterning of a metal layer; subsequently, the CMOS stack 6, including the stacked dielectric layers 6a and conductive layers 6b, is formed, via deposition and patterning of alternated dielectric and metal layers. Then, as shown in FIG. 7B, the passivation layer 8 is formed on the CMOS stack 6.

Figure 7C:
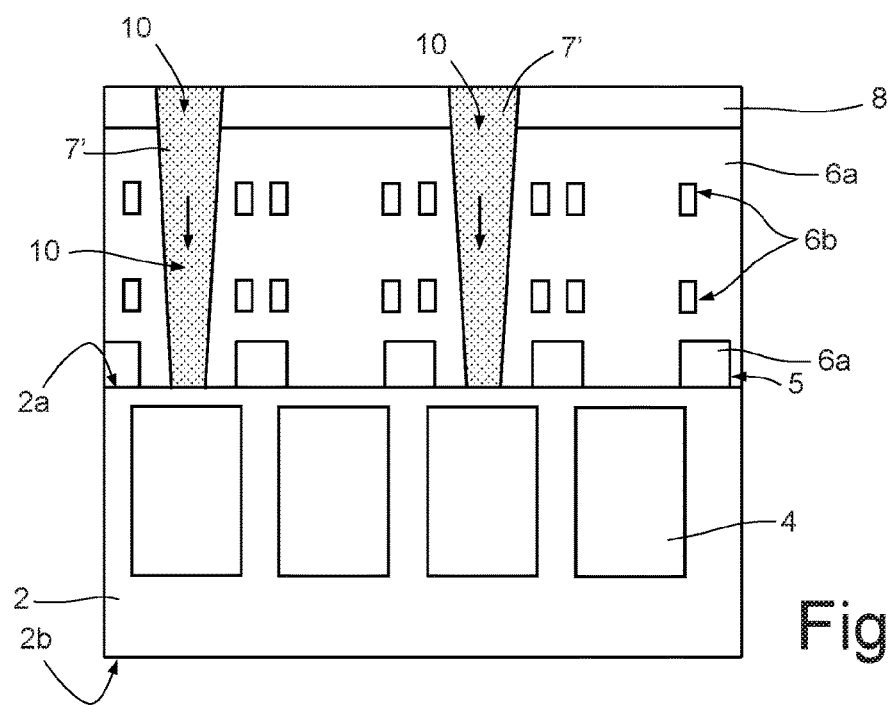

The light channelling regions 7' and corresponding UV conversion regions 10 are formed through the stack 6 and passivation layer 8, as shown in FIG. 7C, vertically corresponding to the positions of the photodetector active areas 4, which are intended to perform detection of the UV light radiation; in particular, trenches are first formed through the CMOS stack 6 and passivation layer 8, starting from its external surface and reaching the front surface 2a of the substrate 2, and then the same trenches are filled with the suitable material, designed for conversion of UV light radiation into visible light radiation, via deposition of a photo-patternable material, which is removed outside of the same trenches.

Figure 7D:
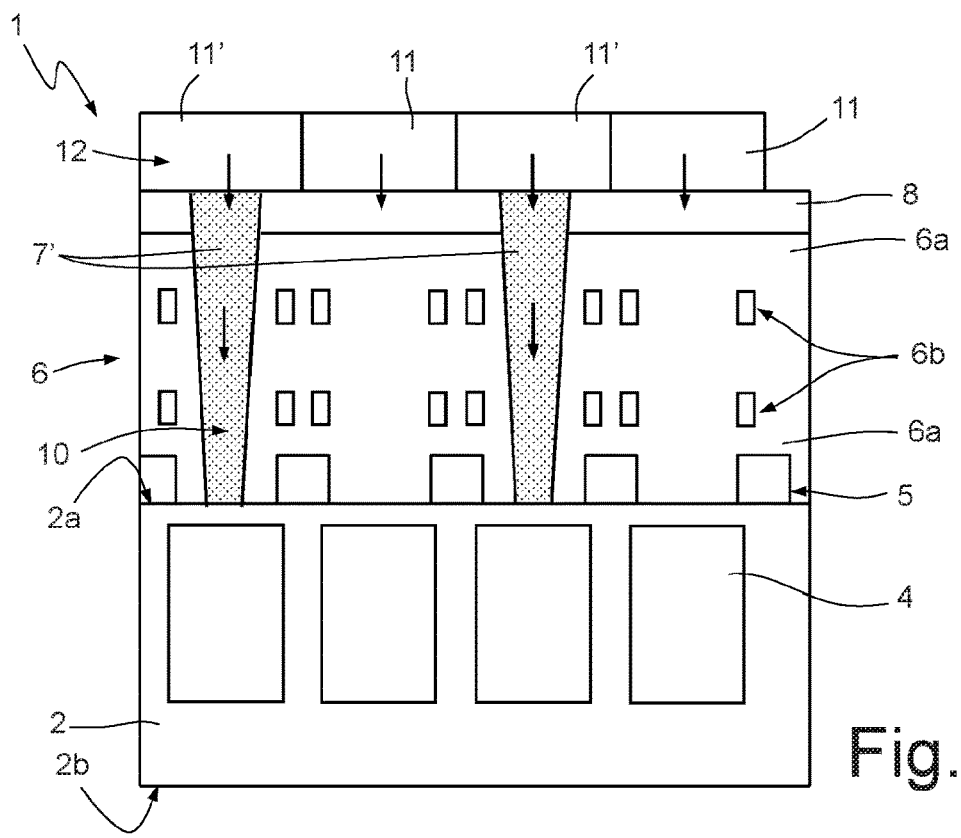

Afterwards, the capping layer 12 is formed on the passivation layer 8, as shown in FIG. 7D, with the alternated filter and transparent regions 11, 11'.

Figure 6:
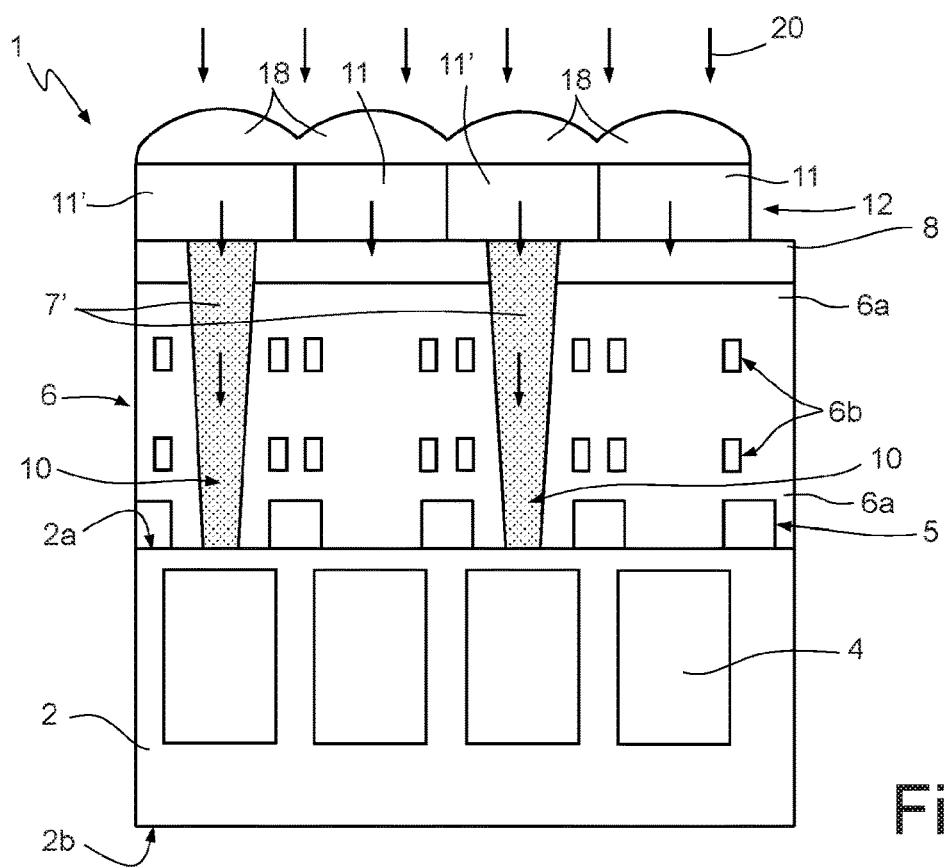
FIG. 6 is a cross-section of a semiconductor optical sensor, according to a second embodiment of the present solution.

The micro-lens units 18 may then be formed on the capping layer 12, thereby obtaining the structure shown in FIG. 6.

The advantages that the proposed solution allows to achieve are clear from the foregoing disclosure.

In any case, it is again underlined that the disclosed solution offers a number of improvements compared to prior art solutions, among which:
the possibility to reconstruct UV and visible light starting from a same focused image on the chip, containing information coming from both spectral ranges, with a same spatial resolution;
an easier and cheaper integration;
a smaller area occupation, leading to a more compact system.

The disclosed second embodiment may be advantageous, since it allows to detect visible light across a deeper active area, since the UV conversion regions 10 are distributed within the whole depth of the light channelling regions 7'.

The manufacturing process of the semiconductor optical sensor 1 generally requires additional steps that are performed advantageously at the BEOL, or back-end, steps of a standard CMOS manufacturing process, thus not requiring extensive modifications to common processes.

The features discussed above are particularly advantageous in case the semiconductor optical sensor 1 is embedded inside a mobile device, like a smart phone, a tablet, or in general a mobile device or handset; indeed, the discussed solution allows to achieve the low cost and low size requirements that are generally required to mobile devices.

Finally, it is clear that modifications and variations may be made to what has been described and illustrated herein, without thereby departing from the scope of the present invention, as defined in the annexed claims.

In particular, it is again underlined that different patterns may be envisaged in the array 15 of the optical sensor 1 in the image detection area 15', with respect to the alternated arrangement of the pixels designed to detect visible light radiation and those to detect UV radiation.

Figure 8:
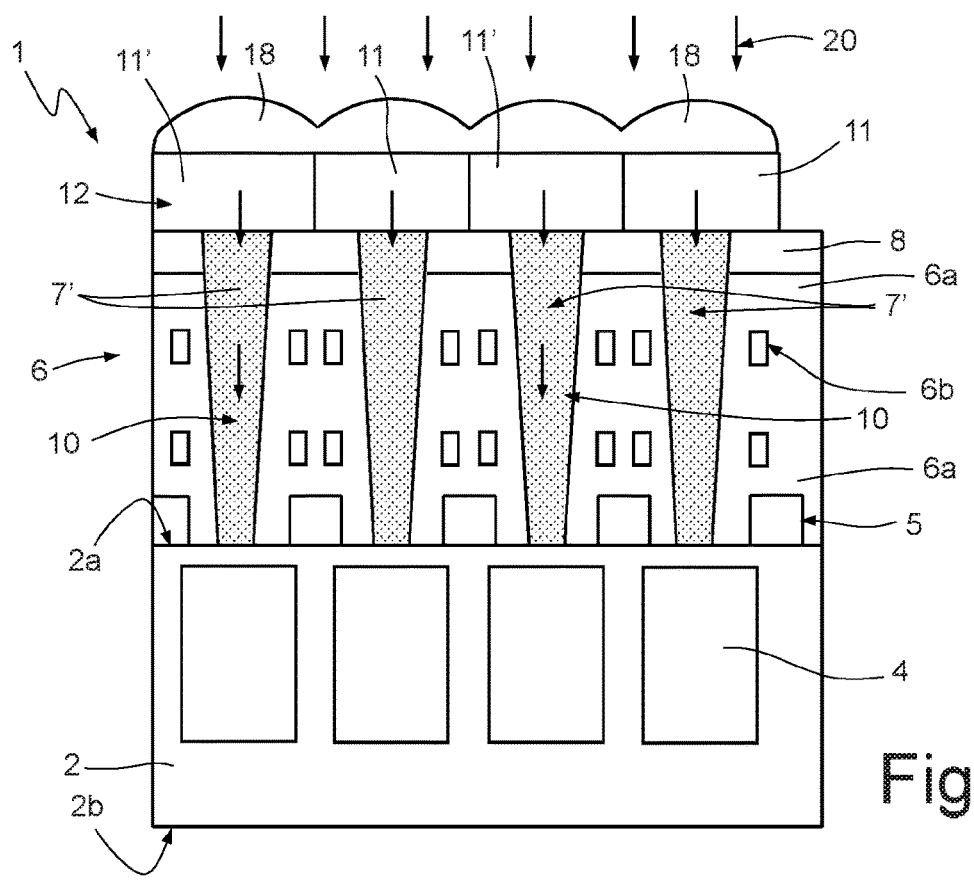
FIG. 8 is a cross-section of a semiconductor optical sensor, according to a further aspect of the present solution.

Moreover, in a further possible embodiment, shown in FIG. 8, which is otherwise similar to the second embodiment of FIG. 6, the light channelling regions 7' may be provided on all the photodetector active areas 4.

It is also underlined that the discussed solution is suitable for both front-side and back-side illuminated sensors, and various type of photodetectors, including for example p-n junctions, p-i-n detectors or SPAD avalanche photodiodes.

The invention claimed is:

1. A semiconductor optical sensor (1), comprising:
a substrate (2) integrating a plurality of photodetector active areas (4); and
a CMOS layer stack (6) arranged on the substrate (2) and including a number of dielectric (6a) and conductive (6b) layers;
further comprising UV conversion regions (10) arranged above a number of first photodetector active areas (4) and configured to convert UV light radiation into visible light radiation towards said first photodetector active areas (4), said first photodetector active areas (4) being thereby designed to define first photodetection units (16) for UV light detection,
wherein the first photodetector active areas (4) are alternated to a number of second photodetector active areas (4), integrated in the substrate (2) and designed to define second photodetection units (16) for visible light detection, the first and second photodetection units forming an array (15) of photodetection units (16) of the optical sensor (1), jointly defining a single image detection area (15') sensitive to both UV and visible light radiation,
characterized by further comprising filter regions (11), arranged above said second photodetector active areas (4) and made of a material transparent to visible light radiation and opaque to UV light radiation, and
further characterized in that the single image detection area (15') is designed to be sensitive to both UV and visible light radiation, at a same time and with a same spatial resolution.

2. The sensor according to claim 1, wherein the UV conversion regions (10) include an organic material in which a fluorescent dye is immersed, the fluorescent dye being designed to perform the UV conversion.

3. The sensor according to claim 1, wherein the organic material is a down-conversion material capable of absorbing UV light and emitting visible light radiation, chosen among: Lumogen, Coronene, AlQ3' and ZnS:Mn.

4. The sensor according to claim 1, wherein the UV conversion regions (10) are alternated to the filter regions

(11) within a capping layer (12) arranged above the first and second photodetector active areas (4).

5. The sensor according to claim 4, wherein the CMOS stack (6) is arranged on a top surface (2a) of said substrate (2), opposite to a back surface (2b) of said substrate (2) defining an outer surface of said optical sensor (1); wherein the capping layer (12) is arranged above a top dielectric layer (6a) of the CMOS stack (6).

6. The sensor according to claim 4, wherein the CMOS stack (6) is arranged on a top surface (2a) of said substrate (2), and a top dielectric layer (6a) of the CMOS stack (6) is arranged at an outer surface of said optical sensor (1); wherein the capping layer (12) is arranged above a back surface (2b) of said substrate (2), opposite to said front surface (2a).

7. The sensor according to claim 1, further comprising light channelling regions (7') formed within trenches through the CMOS stack (6), from a top dielectric layer (6a) towards a front surface (2a) of the substrate (2), the light channelling regions (7') including a material designed to define the UV conversion regions (10), integrated within the CMOS stack (6); wherein the light channelling regions (7') are arranged on respective first photodetector active areas (4) and configured to guide light radiation towards the respective first photodetector active areas.

8. The sensor according to claim 7, comprising transparent regions (11') alternated to the filter regions (11) within a capping layer (12) arranged above a top dielectric layer (6a) of the CMOS stack (6), the transparent regions (11') designed to be transparent to both visible light and UV light radiation.

9. The sensor according to claim 7, wherein the light channelling regions (7') are also arranged on respective second photodetector active areas (4) and configured to guide light radiation towards the respective second photodetector active areas (4).

10. The sensor according to claim 1, wherein the filter regions (11) are transparent to a respective portion of the visible light spectrum, to implement RGB, Red, Green and Blue, filters, designed to filter the visible light radiation.

11. A process for manufacturing a semiconductor optical sensor (1), comprising:
providing a substrate (2);
forming a plurality of photodetector active areas (4) within the substrate (2); and
forming a CMOS layer stack (6) arranged on the substrate (2) and including a number of dielectric (6a) and conductive (6b) layers;
further comprising forming UV conversion regions (10) arranged above a number of first photodetector active areas (4) and configured to convert UV light radiation into visible light radiation towards said first photodetector active areas (4), said first photodetector active areas (4) being thereby designed to define first photodetection units (16) for UV light detection,
further comprising integrating in the substrate (2) a number of second photodetector active areas (4), alternated to the first photodetector active areas (4) and designed to define second photodetection units (16) for visible light detection, the first and second photodetection units
forming an array (15) of photodetection units (16) of the optical sensor (1), jointly defining a single image detection area (15') sensitive to both UV and visible light radiation,
characterized by further comprising forming filter regions (11) arranged above said second photodetector active areas (4), made of a material transparent to visible light radiation and opaque to UV light radiation, and
further characterized by forming a single color image displaying visible and UV information at a same time and with a same spatial resolution.

12. The process according to claim 11, wherein forming UV conversion regions (10) comprises depositing an organic material in which a fluorescent dye is immersed, the fluorescent dye being designed to perform the UV conversion.

13. The process according to claim 11, wherein forming the UV conversion regions (10) and the filter regions (11) comprises depositing a photo-patternable organic material layer with a fluorescent dye dispersed therein, to create patches of fluorescent material defining the UV conversion regions (10).

14. The process according to claim 11, further comprising:
forming light channelling regions (7') within trenches through the CMOS stack (6), from a top dielectric layer (6a) towards a front surface (2a) of the substrate (2); and
filling the light channelling regions (7') with a material designed to define the UV conversion regions (10) integrated within the CMOS stack (6); wherein the light channelling regions (7') are each arranged on a respective first photodetector active area (4) and configured to guide light radiation towards the respective first photodetector active area.

15. The process according to claim 14, comprising forming transparent regions (11') alternated to the filter regions (11) within a capping layer (12) arranged above a top dielectric layer (6a) of the CMOS stack (6), the transparent regions (11') designed to be transparent to the visible light and the UV light radiation.

* * * * *